United States Patent
Wu et al.

(10) Patent No.: US 9,741,972 B2
(45) Date of Patent: Aug. 22, 2017

(54) OLED DEVICE AND PREPARATION METHOD THEREOF, AND DISPLAY DEVICE

(71) Applicant: BOE Technology Group Co., Ltd., Beijing (CN)

(72) Inventors: Chang Yen Wu, Beijing (CN); Chin Lung Liao, Beijing (CN); Guang Yan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 21 days.

(21) Appl. No.: 14/650,983

(22) PCT Filed: Nov. 17, 2014

(86) PCT No.: PCT/CN2014/091280
§ 371 (c)(1),
(2) Date: Jun. 10, 2015

(87) PCT Pub. No.: WO2015/180425
PCT Pub. Date: Dec. 3, 2015

(65) Prior Publication Data
US 2016/0248048 A1  Aug. 25, 2016

(30) Foreign Application Priority Data
May 30, 2014  (CN) .......................... 2014 1 0240426

(51) Int. Cl.
*H01L 51/56* (2006.01)
*H01L 51/00* (2006.01)
(Continued)

(52) U.S. Cl.
CPC .......... *H01L 51/56* (2013.01); *H01L 51/5092* (2013.01); *H01L 51/0003* (2013.01);
(Continued)

(58) Field of Classification Search
CPC . H01L 51/56; H01L 51/0003; H01L 51/5092; H01L 51/5072; H01L 51/0013; H01L 51/5088; H01L 51/5056
See application file for complete search history.

(56) References Cited

U.S. PATENT DOCUMENTS 7,948,163 B2    5/2011 Parthasarathy et al.
2004/0096570 A1*  5/2004 Weaver ............... H01L 51/5012
                                                      427/66

(Continued)

FOREIGN PATENT DOCUMENTS

CN      1691850 A    11/2005
CN    101719543 A     6/2010
(Continued)

OTHER PUBLICATIONS

May 5, 2016—(CN) Second Office Action Appn 201410240426.4 with English Tran.
(Continued)

*Primary Examiner* — Donald Raleigh
(74) *Attorney, Agent, or Firm* — Banner & Witcoff, Ltd.

(57) ABSTRACT

An OLED device and a preparation method thereof, and a display device are provided. The OLED device comprises a substrate and a plurality of functional layers disposed sequentially on the substrate. One functional layer of the plurality of functional layers is a transition functional layer, the transition functional layer comprises a first sub-layer and a second sub-layer provided on the first sub-layer, the first sub-layer and the second sub-layer are made of a same material; and the first sub-layer is prepared by using a first process, and the second sub-layer is prepared by using a second process different from the first process.

15 Claims, 2 Drawing Sheets

(51) Int. Cl.
*H01L 51/50* (2006.01)
*H01L 51/52* (2006.01)

(52) U.S. Cl.
CPC ...... *H01L 51/0013* (2013.01); *H01L 51/5012* (2013.01); *H01L 51/5056* (2013.01); *H01L 51/5072* (2013.01); *H01L 51/5088* (2013.01); *H01L 51/5221* (2013.01)

(56) References Cited

U.S. PATENT DOCUMENTS

| | | | |
|---|---|---|---|
| 2007/0235742 A1 | 10/2007 | Tobise et al. | |
| 2010/0045176 A1* | 2/2010 | Kim | H01L 51/5234 313/504 |
| 2010/0210047 A1* | 8/2010 | Sasaki | H01L 51/5256 438/26 |
| 2012/0211782 A1* | 8/2012 | Matsuda | H05B 33/22 257/89 |
| 2015/0041780 A1* | 2/2015 | Ma | H01L 51/0067 257/40 |

FOREIGN PATENT DOCUMENTS

| | | | | |
|---|---|---|---|---|
| CN | 102881843 A | 1/2013 | | |
| CN | 103311459 A | 9/2013 | | |
| CN | 103682116 A | 3/2014 | | |
| CN | 103794730 A | 5/2014 | | |
| CN | 104022229 A | 9/2014 | | |
| JP | 200176874 A | 3/2001 | | |
| WO | WO 2013039914 A1 * | 3/2013 | ........... | H01L 51/006 |

OTHER PUBLICATIONS

Weixin Li, et al., Maximizing Alq3 OLED Internal and External Efficiencies: Charge Balanced Device Structure and Color Conversion Outcoupling Lenses, Journal of Display Technology, vol. 2, No. 2, Jun. 2006, English Tran of Abstract.

Feb. 27, 2015—International Search Report and Written Opinion Appn PCT/CN2014/091280 with English Tran.

Nov. 16, 2015—(CN)—First Office Action Appn 201410240426.4 with English Tran.

Nov. 8, 2016—(CN) Third Office Action Appn 201410240426.4 with English Tran.

* cited by examiner

OLED DEVICE AND PREPARATION METHOD THEREOF, AND DISPLAY DEVICE

The application is a U.S. National Phase Entry of International Application No. PCT/CN2014/091280 filed on Nov. 17, 2014, designating the United States of America and claiming priority to Chinese Patent Application No. 201410240426.4 filed on May 30, 2014. The present application claims priority to and the benefit of the above-identified applications and the above-identified applications are incorporated by reference herein in their entirety.

TECHNICAL FIELD

Embodiments of the disclosure relate to an OLED device and a preparation method thereof, and a display device.

BACKGROUND

Currently, a mainstream process of mass production of an organic electroluminescent device (e.g., an Organic Light-Emitting Diode (OLED)) is a vacuum thermal evaporation process, i.e., an organic material is heated, gasified and then uniformly deposited on a substrate under a high vacuum condition. By using the vacuum thermal evaporation process, an anode, a hole injection layer (HIL), a hole transport layer (HTL), an emission layer (EML), an electron transport layer (ETL), an electron injection layer (EIL) and a cathode are sequentially formed on the substrate. However, the vacuum thermal evaporation process requires relatively expensive cost for a vacuum process and an evaporation mask and the like, and a material utilization ratio in the vacuum thermal evaporation process is extremely low. In order to solve these problems, a solution process is proposed to prepare the OLED device, i.e., the substrate is coated in a solution mode, so as to sequentially form the above layers of the OLED device and to reduce the fabrication cost. However, there are still many problems in the solution process. For example, solvents are used in the solution process; in the case that a plurality of film layers have been formed and then the solvent for other film layer is coated thereon, it is likely that the film layers that have been dried and finally formed are dissolved, such that the respective layers of the OLED device blend with one another and a waste product is resulted.

Therefore, it is proposed that the OLED device is prepared by the solution process and the vacuum thermal evaporation process, i.e., several film layers (e.g., the anode, the HIL and the HTL) are prepared by using the solution process firstly, and then the remaining film layers (e.g., the EML, the ETL, the EIL and the cathode) are prepared by using the vacuum thermal evaporation process. In this way, the fabrication cost is reduced to some extent and the efficiency and yield are improved to some extent.

However, at the heterogeneous interface between the film layer (e.g., the HTL) prepared by using the solution process and the film layer (e.g., the EML) prepared by using the vacuum thermal evaporation process, there are many defects (e.g., impurities, pores, etc.) generated due to the switch of processes, which seriously affects light emission efficiency of the OLED device and greatly reduces a service life of an OLED display panel.

SUMMARY

Embodiments of the disclosure provide an OLED device. The OLED device comprises a substrate and a plurality of functional layers disposed sequentially on the substrate. One functional layer of the plurality of functional layers is a transition functional layer, the transition functional layer comprises a first sub-layer and a second sub-layer provided on the first sub-layer, the first sub-layer and the second sub-layer are made of a same material; and the first sub-layer is prepared by using a first process, and the second sub-layer is prepared by using a second process different from the first process.

For example, the first process is a solution process; and the second process is any one of vacuum thermal evaporation process, organic vapor phase deposition process, laser induced thermal imaging process, and radiation-induced sublimation transfer process.

For example, functional layers provided between the substrate and the first sub-layer are all prepared by using the first process, and functional layers provided above the second sub-layer are all prepared by using the second process.

For example, the plurality of functional layers disposed sequentially on the substrate comprise an anode, a hole injection layer, a hole transport layer, an emission layer, an electron transport layer, an electron injection layer and a cathode, and the transition functional layer is any one of the anode, the hole injection layer, the hole transport layer, the emission layer, the electron transport layer, the electron injection layer and the cathode.

For example, the plurality of functional layers disposed sequentially on the substrate comprise an anode, a hole transport layer, an emission layer, an electron transport layer and a cathode, and the transition functional layer is any one of the anode, the hole transport layer, the emission layer, the electron transport layer and the cathode.

For example, the plurality of functional layers disposed sequentially on the substrate comprise an anode, a hole transport layer, an electron blocking layer, an emission layer, a hole blocking layer, an electron transport layer and a cathode, and the transition functional layer is any one of the anode, the hole transport layer, the electron blocking layer, the emission layer, the hole blocking layer, the electron transport layer and the cathode.

For example, the plurality of functional layers disposed sequentially on the substrate comprise an anode, a hole injection layer, a hole transport layer, an electron blocking layer, an emission layer, a hole blocking layer, an electron transport layer, an electron injection layer and a cathode, and the transition functional layer is any one of the anode, the hole injection layer, the hole transport layer, the electron blocking layer, the emission layer, the hole blocking layer, the electron transport layer, the electron injection layer and the cathode.

For example, the solution process is any one of spin coating process, blade coating process, electrospray coating process, slot coating process, stripe coating process, dip coating process, roll coating process, ink jet printing process, nozzle printing process, and relief printing process.

The embodiments of the disclosure provide a display device. The display device comprises the OLED device as described above.

The embodiments of the disclosure provide a preparation method of an OLED device. The method comprises: providing a substrate; sequentially forming a plurality of functional layers on the substrate. One functional layer of the plurality of functional layers is a transition functional layer, the transition functional layer comprises a first sub-layer and a second sub-layer provided on the first sub-layer, the first sub-layer and the second sub-layer are made of a same material; and a preparation procedure of the transition functional layer comprises: the first sub-layer is prepared by using a first process, and the second sub-layer is prepared by using a second process different from the first process.

For example, the first process is a solution process; and the second process is any one of vacuum thermal evaporation process, organic vapor phase deposition process, laser induced thermal imaging process, and radiation-induced sublimation transfer process.

For example, functional layers provided between the substrate and the first sub-layer are all prepared by using the first process, and functional layers provided above the second sub-layer are all prepared by using the second process.

For example, the plurality of functional layers disposed sequentially on the substrate comprise an anode, a hole injection layer, a hole transport layer, an emission layer, an electron transport layer, an electron injection layer and a cathode, and the transition functional layer is any one of the anode, the hole injection layer, the hole transport layer, the emission layer, the electron transport layer, the electron injection layer and the cathode.

For example, the plurality of functional layers disposed sequentially on the substrate comprise an anode, a hole transport layer, an emission layer, an electron transport layer and a cathode, and the transition functional layer is any one of the anode, the hole transport layer, the emission layer, the electron transport layer and the cathode.

For example, the plurality of functional layers disposed sequentially on the substrate comprise an anode, a hole transport layer, an electron blocking layer, an emission layer, a hole blocking layer, an electron transport layer and a cathode, and the transition functional layer is any one of the anode, the hole transport layer, the electron blocking layer, the emission layer, the hole blocking layer, the electron transport layer and the cathode.

For example, the plurality of functional layers disposed sequentially on the substrate comprise an anode, a hole injection layer, a hole transport layer, an electron blocking layer, an emission layer, a hole blocking layer, an electron transport layer, an electron injection layer and a cathode, and the transition functional layer is any one of the anode, the hole injection layer, the hole transport layer, the electron blocking layer, the emission layer, the hole blocking layer, the electron transport layer, the electron injection layer and the cathode.

For example, the solution process is any one of spin coating process, blade coating process, electrospray coating process, slot coating process, stripe coating process, dip coating process, roll coating process, ink jet printing process, nozzle printing process, and relief printing process.

BRIEF DESCRIPTION OF THE DRAWINGS

In order to clearly illustrate the technical solution of the embodiments of the disclosure or the prior art, the drawings of the embodiments or in description of the prior art will be briefly described in the following; it is obvious that the described drawings are only related to some embodiments of the disclosure; for those ordinarily skilled in the art, other drawings can further be obtained based on these drawings without inventive effort.

DESCRIPTION OF THE EMBODIMENTS

Hereinafter, the technical solutions of the embodiment of the disclosure will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
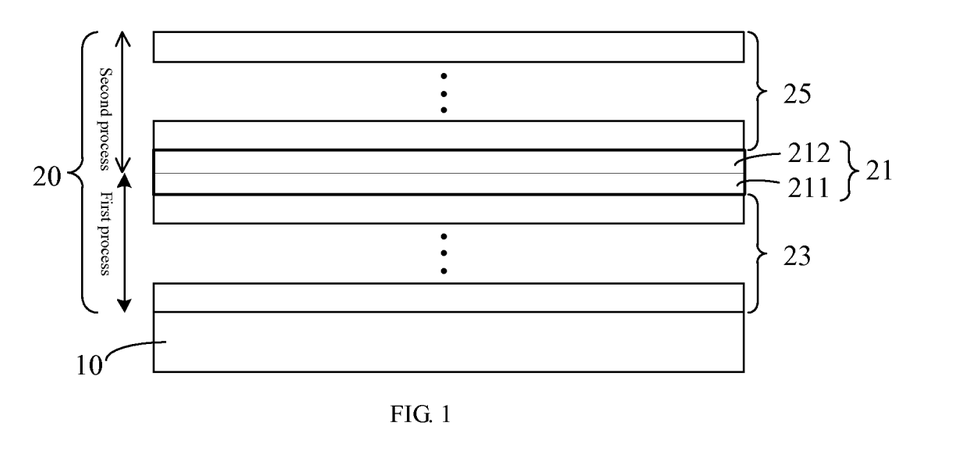
FIG. 1 is a structural schematic view illustrating an OLED device according to embodiments of the disclosure.

As shown in FIG. 1, embodiments of the disclosure provide an OLED device, the OLED device comprises a substrate 10 and a plurality of functional layers 20 disposed sequentially on the substrate 10. One functional layer of the plurality of functional layers 20 is a transition functional layer 21, the transition functional layer 21 comprises a first sub-layer 211 and a second sub-layer 212 provided on the first sub-layer 211, the first sub-layer 211 and the second sub-layer 212 are made of a same material; the first sub-layer 211 is prepared by using a first process, and the second sub-layer 212 is prepared by using a second process different from the first process.

In the OLED device according to the embodiments of the disclosure, in the case that the transition functional layer is prepared, the first sub-layer 211 is prepared by using the first process at first, and then the second sub-layer 212 is prepared by using the second process; furthermore, since the first sub-layer 211 and the second sub-layer 212 are made of the same material, the process switching is performed within the film layers of same material in the case that the preparation process switches from the first process to the second process, which can effectively reduce the defects brought about by the process switching. That is to say, the process switching according to the embodiments of the disclosure is completed in the same material; compared with the case that a process switching is performed at a heterogeneous interface in the prior art, the OLED device according to the embodiments of the disclosure not only reduces or avoids the defects between the film layers prepared by different processes but also minimizes adverse effect caused by the process switching. Accordingly, a good homogenous interface is formed in the transition functional layer 21, so that the light emission efficiency of the OLED device is effectively increased, and the service life and the performance of an OLED display panel comprising the OLED device is greatly increased.

It should be noted that, the defects generated during the process switching performed at the homogenous interface is far less than the defects generated during the process switching performed at the heterogeneous interface; and the influence of the defects generated at the homogenous interface on the OLED display panel is far less than the influence of the defects generated at the heterogeneous interface on the OLED display panel, which will be described in detail hereinafter.

It should also be noted that, in the OLED device according to the embodiments of the disclosure, before the plurality of functional layers 20 are prepared, structures such as thin film layer transistors (TFT) arranged in an array may be formed on the substrate 10 in advance, to ensure normal operation of the OLED device, which will not be limited by the embodiments of the disclosure.

In the embodiments of the disclosure, the first process for example is a solution process; the second process for example is any one of vacuum thermal evaporation process, organic vapor phase deposition (OVPD) process, laser induced thermal imaging (LITI) process, and radiation-induced sublimation transfer (RIST) process. For example, the second process is the vacuum thermal evaporation process.

For example, in the embodiments of the disclosure, the plurality of functional layers 20 are sequentially disposed on the substrate 10; the functional layers 23 between the substrate 10 and the first sub-layer 211 are all prepared by using the first process, and the functional layers 25 above the second sub-layer 212 are all prepared by using the second process.

It should be noted that, in the embodiments of the disclosure, in the case that the transition functional layer 21 is a first functional layer disposed on the substrate 10, no other functional layers 23 exist between the substrate 10 and the first sub-layer 211; in the case that the transition functional layer 21 is a last functional layer disposed on the substrate 10, no other functional layers 25 exist above the second sub-layer 212. These two cases will be illustrated in detail hereinafter with specific examples.

Figure 2:
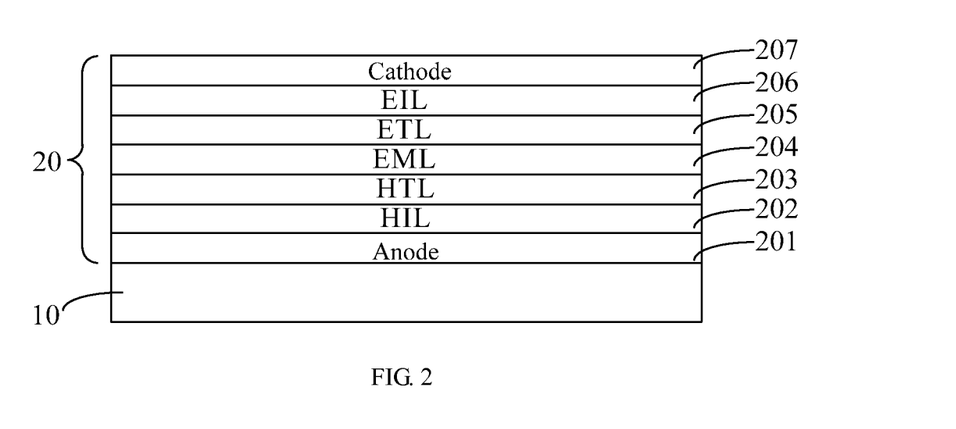
FIG. 2 is a structural schematic view illustrating the OLED device according to the embodiments of the disclosure.

For example, as shown in FIG. 2, the plurality of functional layers 20 disposed sequentially on the substrate 10 are: an anode 201, a hole injection layer HIL202, a hole transport layer HTL203, an emission layer EML204, an electron transport layer ETL205, an electron injection layer EIL206 and a cathode 207, and the transition functional layer is any one of the seven functional layers.

For example, the transition functional layer is the anode 201, the anode 201 comprises a first anode (i.e., the first sub-layer) and a second anode (i.e., the second sub-layer) provided on the first anode, and the first anode and the second anode are made of the same material. The first anode is prepared by using the solution process (since the transition functional layer is the anode 201 which is the first functional layer disposed on the substrate 10, no other functional layers exist between the substrate 10 and the first anode); and the second anode, as well as the hole injection layer HIL202, the hole transport layer HTL203, the emission layer EML204, the electron transport layer ETL205, the electron injection layer EIL206 and the cathode 207 provided above the second anode are all prepared by using the vacuum thermal evaporation process.

For example, the transition functional layer is the hole injection layer HIL202, the hole injection layer HIL202 comprises a first hole injection layer and a second hole injection layer provided on the first hole injection layer, the first hole injection layer and the second hole injection layer are made of the same material. The first hole injection layer, and the anode 201 between the substrate 10 and the first hole injection layer are both prepared by using the solution process; and the second hole injection layer, as well as the hole transport layer HTL203, the emission layer EML204, the electron transport layer ETL205, the electron injection layer EIL206 and the cathode 207 provided above the second hole injection layer are all prepared by using the vacuum thermal evaporation process.

For example, similarly, the transition functional layer is the hole transport layer HTL203, the emission layer EML204, the electron transport layer ETL205 or the electron injection layer EIL206, which will not be illustrated in detail by the embodiments of the disclosure.

For example, the transition functional layer is the cathode 207, the cathode 207 comprises a first cathode and a second cathode provided on the first cathode, and the first cathode and the second cathode are made of the same material. The first cathode, as well as the anode 201, the hole injection layer HIL202, the hole transport layer HTL203, the emission layer EML204, the electron transport layer ETL205, and the electron injection layer EIL206 between the substrate 10 and the first cathode are all prepared by using the solution process; and the second cathode is prepared by using the vacuum thermal evaporation process (since the transition functional layer is the cathode 207 which is the last functional layer disposed on the substrate 10, no other functional layers exist above the second cathode).

For example, the anode 201 is made of a material selected from ITO, IZO, AZO, FTO, ZnO, ZITO, GITO, metal materials and the like; the HIL 202 is made of a material selected from CuPc, PEDOT:PSS and the like; the HTL 203 is made of a material selected from TPD, TAPC, TDATA, NPB and the like; the EML 204 is made of a material selected from $AlQ_3$, BalQ, DPVBi and the like; the ETL 205 is made of a material selected from TAZ, PBD, OXD-7, $AlQ_3$, ZnQ, GaQ, BebQ, BalQ, DPVBi, ZnSPB, BBOT and the like; the EIL 206 is made of a material selected from Li, Na, K, LiF, $AlQ_3$, a mixture of $AlQ_3$ and LiQ, and the like; the cathode 207 is made of a material selected from ITO, IZO, Cs, Li, Na, K, Al, Ag, Ca, Li, In, Mg and the like. Q represents an 8-hydroxyquinoline group.

Figure 3:
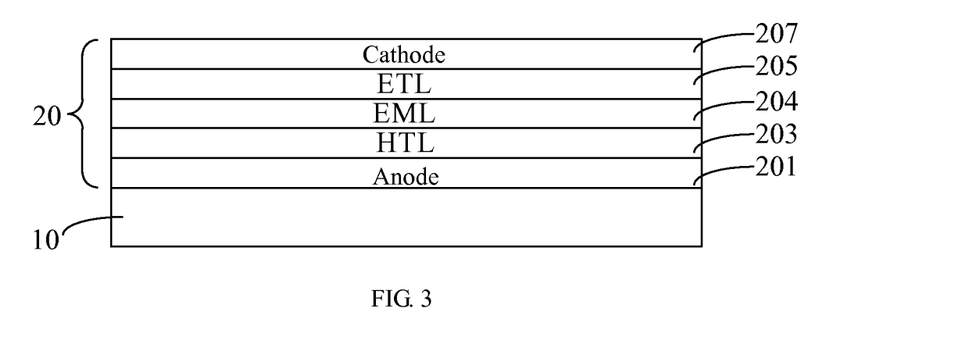
FIG. 3 is a structural schematic view illustrating another OLED device according to the embodiments of the disclosure.

It should be noted that, FIG. 2 is only illustrative, and the embodiments of the disclosure does not specifically limit the structure of the plurality of functional layers 20 on the substrate 10, which can be provided according to an actual situation. For example, as shown in FIG. 3, the plurality of functional layers 20 disposed sequentially on the substrate 10 are: the anode 201, the hole transport layer HTL203, the emission layer EML204, the electron transport layer ETL205, and the cathode 207, and the transition functional layer is any one of the five functional layers. For example, the plurality of functional layers disposed sequentially on the substrate are: the anode, the hole transport layer HTL, an electron blocking layer EBL, the emission layer EML, a hole blocking layer HBL, the electron transport layer ETL, and the cathode; or, the plurality of functional layers disposed sequentially on the substrate are: the anode, the hole injection layer HIL, the hole transport layer HTL, the electron blocking layer EBL, the emission layer EML, the hole blocking layer HBL, the electron transport layer ETL, the electron injection layer EIL and the cathode. In short, the structure of the plurality of functional layers on the substrate will not be limited by the embodiments of the disclosure.

It should be noted that, the solution process according to the embodiments of the disclosure refers to a general term of methods for preparing respective film layers of the OLED device by using various types of solutions. For example, the solution process comprises: spin coating process, blade coating process, electrospray coating (ESC) process, slot coating process, stripe coating process, dip coating process, roll coating process, ink jet printing process, nozzle printing process, or relief printing process. Those skilled in the art can select the specific preparation method according to an actual situation, and specific operational procedures of each method are no longer described in detail by the embodiments of the disclosure.

It should be noted that, for the vacuum thermal evaporation process, the vapor phase deposition, the laser induced thermal imaging, and the radiation-induced sublimation transfer according to the embodiments of the disclosure, those skilled in the art can select respective parameters in the preparation process according to an actual situation, and specific operational procedures are no longer described in detail by the embodiments of the disclosure.

The embodiments of the disclosure further provide a display device, and the display device comprises any one of the OLED devices as described above.

The embodiments of the disclosure further provide a preparation method of an OLED device, by which any one of the above-described OLED devices according to the embodiments of the disclosure is prepared. The method comprises:

S1: providing a substrate;

S2: forming a plurality of functional layers on the substrate sequentially, wherein one functional layer of the plurality of functional layers is a transition functional layer, the transition functional layer comprises a first sub-layer and a second sub-layer provided on the first sub-layer, and the first sub-layer and the second sub-layer are made of a same material.

A preparation procedure of the transition functional layer comprises: preparing the first sub-layer by using a first process, and preparing the second sub-layer by using a second process different from the first process.

In the preparation method of the OLED device according to the embodiments of the disclosure, in the case that the transition functional layer is prepared, the first sub-layer is prepared by using the first process at first, and then the second sub-layer is prepared by using the second process; furthermore, since the first sub-layer and the second sub-layer are made of the same material, the process switching is performed within the film layers of same material in the case that the preparation process switches from the first process to the second process, which can effectively reduce the defects brought about by the process switching. That is to say, the process switching according to the embodiments of the disclosure is completed in the same material; compared with the case that a process switching is performed at a heterogeneous interface in the prior art, the OLED device according to the embodiments of the disclosure not only reduces or avoids the defects between the film layers prepared by different processes but also minimizes adverse effect caused by the process switching. Accordingly, a good homogenous interface is formed in the transition functional layer, so that the light emission efficiency of the OLED device is effectively increased, and the service life and the performance of an OLED display panel comprising the OLED device is greatly increased.

In order to better illustrate the OLED device according to the embodiments of the disclosure, some example of the OLED device according to the embodiments of the disclosure are described below.

Example 1

Figure 4:
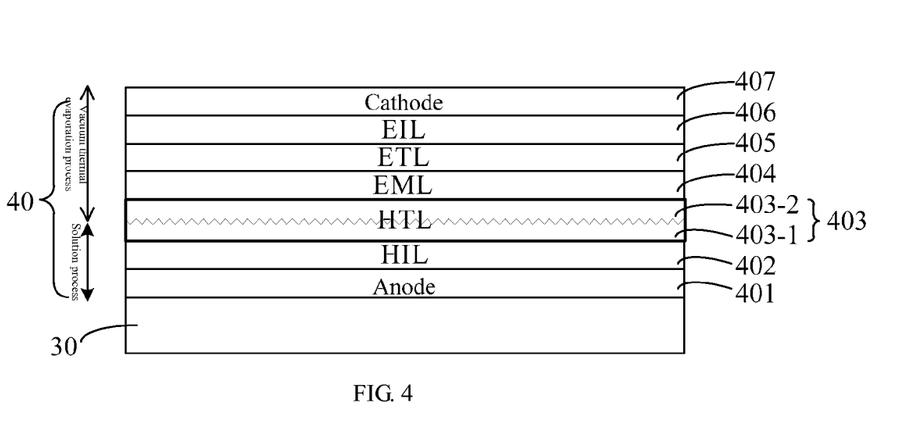
FIG. 4 is a structural schematic view illustrating the OLED device according to Example 1 of the embodiments of the disclosure.

As shown in FIG. 4, Example 1 provides an OLED device, the OLED device comprises a substrate 30; an anode 401, a hole injection layer HIL402 and a first hole transport layer HTL403-1 are firstly formed sequentially on the substrate 30 by using the blade coating process, and then a second hole transport layer HTL403-2, an emission layer EML404, an electron transport layer ETL405, an electron injection layer EIL406, and a cathode 407 are formed sequentially on the first hole transport layer HTL403-1 by using the vacuum thermal evaporation process. The first hole transport layer HTL403-1 and the second hole transport layer HTL403-2 are made of a same material.

That is to say, in this Example 1, the first hole transport layer HTL403-1 which is a last film layer prepared by using the blade coating process of the solution process and the second hole transport layer HTL403-2 which is a first film layer prepared by using the vacuum thermal evaporation process are made of the same material; thus, in the case that the preparation process switches from the blade coating process to the vacuum thermal evaporation process, the process switching is completed within the same material, a smaller number of defects such as impurities or pores are generated on the homogenous interface. Moreover, both the first hole transport layer HTL403-1 and the second hole transport layer HTL403-2 belong to the hole transport layer HTL403, only a physical phenomenon of hole transport occurs within the hole transport layer when the OLED device operates, i.e., holes from the hole injection layer HIL402 are transported to the emission layer EML404 through the hole transport layer HTL403; so, only the hole transport will be influenced even if a smaller number of defects such as impurities or pores do exist.

In the prior art, the anode, the hole injection layer HIL, and the hole transport layer HTL are firstly prepared by using the solution process such as the blade coating process, and then the emission layer EML, the electron transport layer ETL, the electron injection layer EIL and the cathode are prepared by using the vacuum thermal evaporation process; thus, the process switching between the solution process and the vacuum thermal evaporation process is performed at an HTL/EML interface. The HTL and the EML are made of different materials; thus, in the case that the EML is prepared on the HTL by using a process different from the process for the HTL, more defects such as impurities or pores are generated. When the OLED device operates and the holes are transported from the HTL to the EML, the defects such as impurities or pores affect the performance of the OLED device, and a variety of complicated physical or electrochemical reactions such as hole transport, hole accumulation, electron accumulation, exciton generation and photoelectron interaction occurring at the heterogeneous HTL/EML interface reduce electron-hole recombination efficiency in the EML. Thus, the light emission efficiency of the OLED device is reduced, and stability and the service life of the OLED device are significantly reduced That is to say, the defects on the homogenous interface only influence the hole transport; while the defects on the heterogeneous interface not only influence the hole transport but also generate the variety of complicated physical or electrochemical reactions such as the hole accumulation, the electron accumulation, the exciton generation, the photoelectron interaction. So, in the OLED according to the embodiments of the disclosure, not only the number of the defects is reduced, but also the influence of the defects on the OLED display panel is reduced effectively.

Moreover, according to another technique in the prior art, the anode and the hole injection layer HIL are firstly prepared by using the solution process such as the blade coating process, and then the hole transport layer HTL, the emission layer EML, the electron transport layer ETL, the electron injection layer EIL, and the cathode are prepared by using the vacuum thermal evaporation process; thus, the process switching between the solution process and the vacuum thermal evaporation process is performed at an HIL/HTL interface. The HIL and the HTL are made of different materials, in the case that the HTL is prepared on the HIL by using a process from the process for the HIL, more defects such as impurities or pores are generated. When the OLED device operates and the holes are injected from the HIL into the HTL, the defects such as impurities or pores affect efficiency of hole injection and hole transport and cause the hole accumulation at the HIL/HTL interface. Thus, the variety of complicated physical or electrochemical reactions such as the hole injection, the hole transport and the hole accumulation occurring at the heterogeneous HIL/HTL interface affect an energy transfer procedure and reduce the number of holes transported to the EML, so as to reduce the electron-hole recombination efficiency in the EML. Thus, the light emission efficiency of the OLED device is reduced, the operating voltage is increased, the stability of the OLED device is substantially influenced with change of operation time, and the service life of the OLED device is substantially reduced.

From the above analysis, it can be seen that, compared to the prior art, the OLED device according to this Example 1 effectively reduces adverse effect of the process switching on the OLED device in a simple and extremely feasible mode, so that the service life of the OLED device is effectively improve.

Example 2

Figure 5:
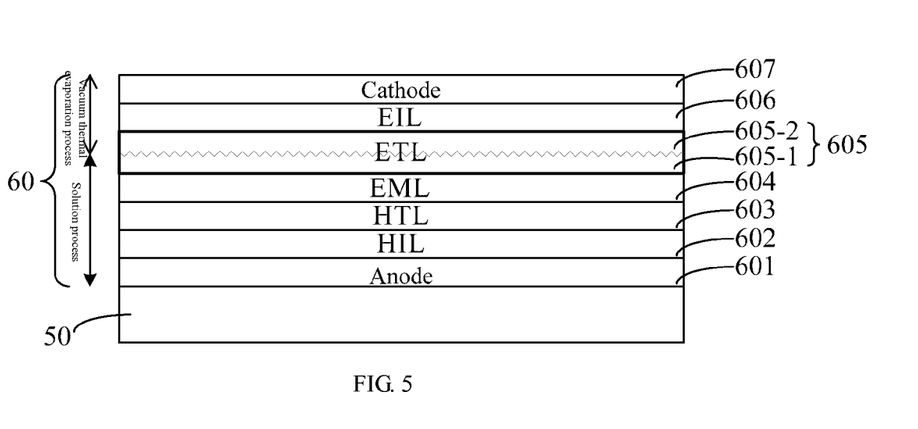
FIG. 5 is a structural schematic view illustrating an OLED device according to Example 2 of the embodiments of the disclosure.

As shown in FIG. 5, Example 2 provides an OLED device, the OLED device comprises a substrate 50; an anode 601, a hole injection layer HIL602, a hole transport layer HTL603, an emission layer EML604 and a first electron transport layer ETL605-1 are firstly formed sequentially on the substrate 50 by using spin coating process, and then a second electron transport layer ETL605-2, an electron injection layer EIL606 and a cathode 607 are formed sequentially on the first electron transport layer ETL605-1 by using the vacuum thermal evaporation process. The first electron transport layer ETL605-1 and the second electron transport layer ETL605-2 are made of a same material.

That is to say, in this Example 2, the first electron transport layer ETL605-1 which is a last film layer prepared by using the spin coating process of the solution process and the second electron transport layer ETL605-2 which is a first film layer prepared by using the vacuum thermal evaporation process are made of the same material; thus, in the case that the preparation process switches from the spin coating process to the vacuum thermal evaporation process, the process switching is performed within the same material, a smaller number of defects such as impurities or pores are generated at the homogenous interface or the defects such as impurities or pores are hardly generated at the homogenous interface. Moreover, both the first electron transport layer ETL605-1 and the second electron transport layer ETL605-2 belong to the electron transport layer ETL605, only the physical phenomenon of electron transport occurs within the electrode transport layer when the OLED device operates, i.e., electrons from the electron injection layer EIL606 are transported to the emission layer EML604 through the electron transport layer ETL605; so, only the electron transport will be influenced even if a smaller number of defects such as impurities or pores do exist.

In the prior art, the anode, the hole injection layer HIL, the hole transport layer HTL, the emission layer EML and the electron transport layer ETL are firstly prepared by using the solution process such as the spin coating process, and then the electron injection layer EIL and the cathode are prepared by using the vacuum thermal evaporation process; thus, the process switching between the solution process and the vacuum thermal evaporation process is performed at an ETL/EIL interface. The ETL and the EIL are made of different materials, in the case that the EIL is prepared on the ETL by using a process different from the process for the ETL, more defects such as impurities or pores are generated. When the OLED device operates and the electrons are injected into the ETL, the defects such as impurities or pores affect efficiency of electron injection and electron transport and generate the electron accumulation at the ETL/EIL interface. Furthermore, the EIL is typically made of a metal or a metal compound whereas the ETL is typically made of an organic high molecule material or organic small molecule material, there is an electrochemical reaction of the organic material and the active metal at the ETL/EIL interface; and in this case, the defects such as impurities or pores make it more difficult for the electron injection. Thus, the variety of complicated physical or electrochemical reactions such as the electron injection, the electron transport, the electron accumulation and the like occurring at the heterogeneous ETL/EIL interface affect an energy transfer procedure and reduce the number of electrons transported to the EML, so as to reduce the electron-hole recombination efficiency in the EML. Thus, the light emission efficiency of the OLED device is reduced, the operating voltage is increased, the stability of the OLED device is substantially influenced with change of operation time, and the service life of the OLED device is substantially reduced.

Moreover, according to another technique in the prior art, the anode, the hole injection layer HIL, the hole transport layer HTL and the emission layer EML are firstly prepared by using the solution process such as the spin coating process, and then the electron transport layer ETL, the electron injection layer EIL and the cathode are prepared by using the vacuum thermal evaporation process; and thus, the process switching between the solution process and the vacuum thermal evaporation process is performed at an EML/ETL interface. The EML and the ETL are made of different materials; in the case that the ETL is prepared on the EML by using a process different from the process for the EML, more defects such as impurities or pores are generated. When the OLED device operates and the electrons are transported from the ETL to the EML, the defects such as impurities or pores affect efficiency of the electron transport and generate the electron accumulation at the EML/ETL interface; when the holes in the EML are transported to this interface, the defects such as impurities or pores result in accumulation of these holes on the EML/ETL interface; and the electrons and the holes accumulated may recombine to cause the exciton generation and the photo-electron interaction on the EML/ETL interface. Thus, the variety of complicated physical or electrochemical reactions such as the electron transport, the electron accumulation, the hole accumulation, the exciton generation and the photo-electron interaction occurring at the interface reduce the electron-hole recombination efficiency in the EML, thus the light emission efficiency of the OLED device is reduced, and the service life of the OLED device is greatly reduced.

From the above analysis, it can be seen that, compared to the prior art, the OLED device according to this Example 2 effectively reduces adverse effect of the process switching on the OLED device in a simple and extremely feasible mode, so as to effectively improve the service life of the OLED device.

Example 3

This Example 3 provides an OLED device, and the OLED device comprises a substrate; a hole injection layer HIL, a hole transport layer HTL and a first emission layer EML are firstly formed sequentially on the substrate by using electrospray coating process, and then a second emission layer EML, an electron transport layer ETL, an electron injection layer EIL and a cathode are formed sequentially on the first emission layer EML by using organic vapor phase deposition process; the first emission layer EML and the second emission layer EML are made of a same material.

Example 4

This Example 4 provides an OLED device, and the OLED device comprises a substrate; a hole injection layer HIL, a hole transport layer HTL, an emission layer EML and a first electron transport layer ETL are firstly formed sequentially on the substrate by using slot coating process, and then a second electron transport layer ETL, an electron injection layer EIL and a cathode are formed sequentially on the first electron transport layer ETL by using laser induced thermal imaging process; the first electron transport layer ETL and the second electron transport layer ETL are made of a same material.

Example 5

This Example 5 provides an OLED device, and the OLED device comprises a substrate; a hole transport layer HTL and a first emission layer EML are firstly formed sequentially on the substrate by using stripe coating process, and then a second emission layer EML, an electron transport layer ETL and a cathode are formed sequentially on the first emission layer EML by using radiation-induced sublimation transfer process; the first emission layer EML and the second emission layer EML are made of a same material.

Example 6

This Example 6 provides an OLED device, and the OLED device comprises a substrate; a hole transport layer HTL, an electron blocking layer EBL, an emission layer EML, a hole blocking layer HBL, an electron transport layer ETL and a first cathode are firstly formed sequentially on the substrate by using relief printing process, and then a second cathode is formed on the first cathode by using organic vapor phase deposition process; the first cathode and the second cathode are made of same material.

Example 7

This Example 7 provides an OLED device, and the OLED device comprises a substrate; a first hole injection layer HIL is firstly formed on the substrate by using nozzle printing process, and then a second hole injection layer HIL, a hole transport layer HTL, an electron blocking layer EBL, an emission layer EML, a hole blocking layer HBL, an electron transport layer ETL, an electron injection layer EIL and a cathode are formed sequentially on the first hole injection layer HIL by using laser induced thermal imaging process; the first hole injection layer HIL and the second hole injection layer HIL are made of a same material.

The foregoing embodiments merely are exemplary embodiments of the disclosure, and not intended to define the scope of the disclosure, and the scope of the disclosure is determined by the appended claims.

The present application claims priority of Chinese Patent Application No. 201410240426.4 filed on May 30, 2014, the disclosure of which is incorporated herein by reference in its entirety as part of the present application.

What is claimed is:

1. A preparation method of an OLED device, comprising:
providing a substrate; and
sequentially forming a plurality of functional layers on the substrate, wherein
one functional layer of the plurality of functional layers is a transition functional layer, the transition functional layer comprises a first sub-layer and a second sub-layer provided on the first sub-layer, and the first sub-layer and the second sub-layer are made of a same material; and
a preparation procedure of the transition functional layer comprises: the first sub-layer is prepared by using a first process, and the second sub-layer is prepared by using a second process different from the first process, wherein
the first process is a solution process, and
the second process is any one of vacuum thermal evaporation process, organic vapor phase deposition process, laser induced thermal imaging process, and radiation-induced sublimation transfer process.

2. The preparation method of the OLED device according to claim 1, wherein
functional layers provided between the substrate and the first sub-layer are all prepared by using the first process, and functional layers provided above the second sub-layer are all prepared by using the second process.

3. The preparation method of the OLED device according to claim 1, wherein
the plurality of functional layers disposed sequentially on the substrate comprise an anode, a hole injection layer, a hole transport layer, an emission layer, an electron transport layer, an electron injection layer, and a cathode, and
the transition functional layer is any one of the anode, the hole injection layer, the hole transport layer, the emission layer, the electron transport layer, the electron injection layer, and the cathode.

4. The preparation method of the OLED device according to claim 1, wherein
the plurality of functional layers disposed sequentially on the substrate comprise an anode, a hole transport layer, an emission layer, an electron transport layer, and a cathode, and
the transition functional layer is any one of the anode, the hole transport layer, the emission layer, the electron transport layer, and the cathode.

5. The preparation method of the OLED device according to claim 1, wherein
the plurality of functional layers disposed sequentially on the substrate comprise an anode, a hole transport layer, an electron blocking layer, an emission layer, a hole blocking layer, an electron transport layer, and a cathode, and
the transition functional layer is any one of the anode, the hole transport layer, the electron blocking layer, the emission layer, the hole blocking layer, the electron transport layer, and the cathode.

6. The preparation method of the OLED device according to claim 1, wherein the plurality of functional layers disposed sequentially on the substrate comprise an anode, a hole injection layer, a hole transport layer, an electron blocking layer, an emission layer, a hole blocking layer, an electron transport layer, an electron injection layer, and a cathode, and the transition functional layer is any one of the anode, the hole injection layer, the hole transport layer, the electron blocking layer, the emission layer, the hole blocking layer, the electron transport layer, the electron injection layer, and the cathode.

7. The preparation method of the OLED device according to claim 1, wherein the solution process is any one of spin coating process, blade coating process, electrospray coating process, slot coating process, stripe coating process, dip coating process, roll coating process, ink jet printing process, nozzle printing process, and relief printing process.

8. The preparation method of the OLED device according to claim 2, wherein the plurality of functional layers disposed sequentially on the substrate comprise an anode, a hole injection layer, a hole transport layer, an emission layer, an electron transport layer, an electron injection layer, and a cathode, and the transition functional layer is any one of the anode, the hole injection layer, the hole transport layer, the emission layer, the electron transport layer, the electron injection layer, and the cathode.

9. A preparation method of an OLED device, comprising:
providing a substrate; and
sequentially forming a plurality of functional layers on the substrate, wherein
one functional layer of the plurality of functional layers is a transition functional layer, the transition functional layer comprises a first sub-layer and a second sub-layer provided on the first sub-layer, and the first sub-layer and the second sub-layer are made of a same material;
a preparation procedure of the transition functional layer comprises: the first sub-layer is prepared by using a first process, and the second sub-layer is prepared by using a second process different from the first process; and
functional layers provided between the substrate and the first sub-layer are all prepared by using the first process, and functional layers provided above the second sub-layer are all prepared by using the second process.

10. The preparation method of the OLED device according to claim 9, wherein the first process is a solution process; and
the second process is any one of vacuum thermal evaporation process, organic vapor phase deposition process, laser induced thermal imaging process, and radiation-induced sublimation transfer process.

11. The preparation method of the OLED device according to claim 10, wherein the solution process is any one of spin coating process, blade coating process, electrospray coating process, slot coating process, stripe coating process, dip coating process, roll coating process, ink jet printing process, nozzle printing process, and relief printing process.

12. The preparation method of the OLED device according to claim 9, wherein the plurality of functional layers disposed sequentially on the substrate comprise an anode, a hole injection layer, a hole transport layer, an emission layer, an electron transport layer, an electron injection layer, and a cathode, and the transition functional layer is any one of the anode, the hole injection layer, the hole transport layer, the emission layer, the electron transport layer, the electron injection layer, and the cathode.

13. The preparation method of the OLED device according to claim 9, wherein the plurality of functional layers disposed sequentially on the substrate comprise an anode, a hole transport layer, an emission layer, an electron transport layer, and a cathode, and the transition functional layer is any one of the anode, the hole transport layer, the emission layer, the electron transport layer, and the cathode.

14. The preparation method of the OLED device according to claim 9, wherein the plurality of functional layers disposed sequentially on the substrate comprise an anode, a hole transport layer, an electron blocking layer, an emission layer, a hole blocking layer, an electron transport layer, and a cathode, and the transition functional layer is any one of the anode, the hole transport layer, the electron blocking layer, the emission layer, the hole blocking layer, the electron transport layer, and the cathode.

15. The preparation method of the OLED device according to claim 9, wherein the plurality of functional layers disposed sequentially on the substrate comprise an anode, a hole injection layer, a hole transport layer, an electron blocking layer, an emission layer, a hole blocking layer, an electron transport layer, an electron injection layer, and a cathode, and the transition functional layer is any one of the anode, the hole injection layer, the hole transport layer, the electron blocking layer, the emission layer, the hole blocking layer, the electron transport layer, the electron injection layer, and the cathode.

\* \* \* \* \*